(12) United States Patent
Canepa

(10) Patent No.: US 10,284,231 B2
(45) Date of Patent: May 7, 2019

(54) ADAPTIVE OUTER CODE FOR CONSISTENT OVERPROVISIONING (OP) LEVEL

(71) Applicant: Seagate Technology, LLC, Cupertino, CA (US)

(72) Inventor: Timothy Canepa, Los Gatos, CA (US)

(73) Assignee: Seagate Technology, LLC, Cupertino, CA (US)

( * ) Notice: Subject to any disclaimer, the term of this patent is extended or adjusted under 35 U.S.C. 154(b) by 223 days.

(21) Appl. No.: 15/610,744

(22) Filed: Jun. 1, 2017

(65) Prior Publication Data

US 2018/0351582 A1    Dec. 6, 2018

(51) Int. Cl.

| | |
|---|---|
| *H03M 13/29* | (2006.01) |
| *G06F 11/10* | (2006.01) |
| *H03M 13/35* | (2006.01) |
| *G06F 3/06* | (2006.01) |
| *G06F 12/02* | (2006.01) |
| *G11C 29/52* | (2006.01) |
| *G11C 29/02* | (2006.01) |
| *G11C 29/42* | (2006.01) |
| *H03M 13/11* | (2006.01) |
| *H03M 13/15* | (2006.01) |

(52) U.S. Cl.
CPC ...... *H03M 13/2909* (2013.01); *G06F 3/0608* (2013.01); *G06F 3/0652* (2013.01); *G06F 3/0688* (2013.01); *G06F 11/1012* (2013.01); *G06F 12/0246* (2013.01); *G11C 29/028* (2013.01); *G11C 29/42* (2013.01); *G11C 29/52* (2013.01); *H03M 13/29* (2013.01); *H03M 13/2906* (2013.01); *H03M 13/2924* (2013.01); *H03M 13/353* (2013.01); *G06F 2212/2022* (2013.01); *G06F 2212/7205* (2013.01); *H03M 13/1102* (2013.01); *H03M 13/152* (2013.01); *H03M 13/1515* (2013.01)

(58) Field of Classification Search
CPC ......... H03M 13/2909; H03M 13/2924; H03M 13/29; H03M 13/353; G06F 11/1012
See application file for complete search history.

(56) References Cited

U.S. PATENT DOCUMENTS

| | | | |
|---|---|---|---|
| 5,737,481 A * | 4/1998 | Gushima | G11B 19/042 386/235 |
| 7,739,576 B2 | 6/2010 | Radke | |
| 7,809,994 B2 | 10/2010 | Gorobets | |

(Continued)

*Primary Examiner* — Joseph D Torres
(74) *Attorney, Agent, or Firm* — Hall Estill Attorneys at Law

(57) ABSTRACT

Method and apparatus for managing data in a memory, such as a flash memory. In accordance with some embodiments, a solid-state non-volatile memory (NVM) has a total user data storage capacity and an overprovisioning (OP) level. A control circuit writes parity data sets to the NVM each having a plurality of code words and an outer code. The code words include inner codes at an inner code rate to detect and correct read errors in a user data payload. The outer code includes parity data at an outer code rate to detect and correct read errors in the code words. A code adjustment circuit increases the inner code rate to compensate for a measured parameter associated with the NVM, and decreases the outer code rate to maintain the data capacity and OP levels above selected thresholds.

20 Claims, 6 Drawing Sheets

(56) References Cited

U.S. PATENT DOCUMENTS

| | | |
|---|---|---|
| 8,001,450 B2 | 8/2011 | Onishi et al. |
| 8,448,045 B2 | 5/2013 | Reddy et al. |
| 9,128,858 B1 * | 9/2015 | Micheloni ............... G06F 11/10 |
| 9,201,728 B2 | 12/2015 | Patapoutian et al. |
| 9,244,766 B2 | 1/2016 | Patapoutian et al. |
| 9,559,725 B1 | 1/2017 | Shao et al. |
| 2008/0172593 A1 * | 7/2008 | Rainish .................. H04N 19/89 |
| | | 714/776 |

* cited by examiner

ADAPTIVE OUTER CODE FOR CONSISTENT OVERPROVISIONING (OP) LEVEL

SUMMARY

Various embodiments of the present disclosure are generally directed to the management of data in a memory, such as but not limited to a flash memory.

In accordance with some embodiments, a solid-state non-volatile memory (NVM) has a total user data storage capacity and an overprovisioning (OP) level. A control circuit writes parity data sets to the NVM each having a plurality of code words and an outer code. The code words include inner codes at an inner code rate to detect and correct read errors in a user data payload. The outer code includes parity data at an outer code rate to detect and correct read errors in the code words. A code adjustment circuit increases the inner code rate to compensate for a measured parameter associated with the NVM, and decreases the outer code rate to maintain the data capacity and OP levels above selected thresholds.

These and other features which may characterize various embodiments can be understood in view of the following detailed discussion and the accompanying drawings.

DETAILED DESCRIPTION

Figure 1:
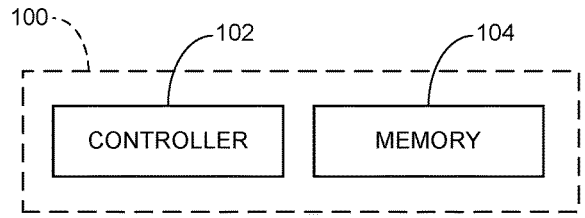
FIG. 1 provides a functional block representation of a data storage device in accordance with various embodiments.

Solid state drives (SSDs) are data storage devices that store user data in non-volatile memory (NVM) made up of an array of solid-state semiconductor memory cells. SSDs usually have an NVM module and a controller. The controller controls the transfer of data between the NVM and a host device. The NVM will usually be NAND flash memory, but other forms of solid-state memory can be used.

Erasable memory such as flash cannot be rewritten in place with updated data. Once data have been written to a selected location (e.g., a page), the location needs to be reset through the use of an erasure operation before new data can be written to that location. New versions of the same data block (e.g., logical block address or LBA) are be written to a new location in the media each time that data block is stored to the NVM.

Flash memory is organized around erasure blocks which represent the smallest unit of memory that can be erased at a time. SSDs often manage erasable memory by grouping erasure blocks into garbage collection units (GCUs) which are allocated and written as a unit. Once a sufficient amount of the data stored in a given GCU has become stale, a garbage collection operation is carried out to recycle the GCU. Current version blocks of user data are identified and written to a new physical location, after which the erasure blocks in the GCU are subjected to an erasure operation. Once erased, the GCU can be returned to an allocation pool awaiting future allocation for the storage of new data, and the cycle repeats.

If a flash memory were to be filled completely with data, it would be difficult if not impossible to carry out a garbage collection operation since there would not be any remaining unused flash space to receive the current version data. To address this, SSDs usually maintain a certain minimum amount of extra available memory space to facilitate such transfers.

This extra available space is not tied to a particular location, but instead represents some amount of free space within the memory that remains available to receive data transfers. This available free space is sometimes referred to as overprovisioning (OP) or the OP level. Depending on a number of factors, OP levels for current generation SSDs can vary from just a few percent of the overall data storage capacity of the flash memory (e.g., 5-7%) up to several tens of percent (e.g. 20-30%) of the overall data storage capacity or more.

Data stored by an SSD are typically protected using two different error protection schemes: inner codes and outer codes. Inner codes may take the form of LDPC (low density parity check) codes or similar which are written to the same flash pages as the regular user data. It is common to divide up each page as an integer number of code words, with each code word having a selected number of user data bits followed by another number of inner code bits. During a data read operation, the desired number of code words are retrieved, and the inner code bits are used to bit errors in the user data portions of the retrieved code words.

Outer codes are stored elsewhere in the flash memory and may be arranged as parity codes to detect and correct errors over multiple pages, such as in a manner similar to existing RAID (redundant arrays of independent disks) parity striping techniques. If uncorrectable errors are detected during a read operation and these errors cannot be successfully recovered using the inner codes, after various retry and recovery operations the controller may ultimately direct reconstruction and recovery of the requested data using the outer codes.

Under normal operational conditions, the inner codes and other read recovery techniques are usually sufficient to enable correction and recovery of the data stored by the flash. The outer codes are only employed in those cases where the errors cannot otherwise be resolved. Invoking the outer codes can add significant time delays and can consume substantial processing resources based on the fact that a large amount of data needs to be retrieved and processed to recover the desired page(s). The use of outer codes also necessarily reduces the amount of available OP in the flash memory for a given user data storage capacity.

Due to a number of aging related effects, flash memory cells will tend to wear and produce greater numbers of bit errors during read operations over time. One way to address this is to incrementally increase the inner code rates to maintain an acceptable level of bit error rate (BER) performance by the memory.

Increasing the inner code rate generally involves increasing the total number of code bits in the flash memory to strengthen the level of error correction available during a read operation. If the size of each code word is fixed, increasing the inner code rate necessarily means that the number of bits in each code word that are used to store user data is decreased by a corresponding amount.

SSD manufacturers are thus faced with a dilemma: to maintain continued performance of a flash memory over time, either the total user data storage capacity of the SSD is decreased, or the total user data storage capacity remains the same and the amount of OP decreases over time. Because of market pressures, it is not economically desirable to provide flash memories with large initial OP levels to account for the erosion of the available memory space necessary to support increases in inner code rates over the operational life of the SSD.

Accordingly, various embodiments are directed to an apparatus and method for managing data in a non-volatile memory (NVM), such as but not limited to a NAND flash memory in an SSD. As explained below, some embodiments organize the NVM to have at least a minimum total user data storage capacity. An additional amount of overprovisioning (OP) space is maintained in the NVM to accommodate recycling operations (e.g., garbage collection).

User data are stored to blocks of the NVM and are protected using inner codes and outer codes. The inner codes are determined and stored on a code word basis. Outer codes are determined on a multiple code word basis. Each of the inner codes and the outer codes are generated at respective inner code and outer code rates, which generally represent ratios of the required memory space for the respective codes in comparison to the amount of memory space occupied by the data protected by such codes.

Adjustments are adaptively made to increase the inner code rate over time in response to measured parameter associated with the NVM, such as observed bit error rate (BER), accumulated program/erase (P/E) counts, etc. The adjustments to the inner code rate serve to maintain the NVM at an acceptable level of data transfer performance, but necessarily result in the expansion of the inner code bits to occupy more available space within the NVM. This results in either a contraction of the space available to store user data blocks, or a reduction in the available OP. To counter this, corresponding adjustments are made to decrease the outer code rate.

In this way, both a total available user data capacity and at least a minimum threshold level of OP can be maintained for the NVM over the operational life of the memory, while maintaining data transfer rates at acceptable performance levels (e.g., average command completion times, data throughput rates, BER, etc.). In one example, if an initial outer code rate is provided at $\frac{1}{16}$ of a group of pages (e.g., 1 out of 16 pages will constitute outer code), this ratio may be decreased over time so that a larger number of pages are protected by each page of outer code, such as $\frac{1}{24}$ (e.g., 1 out of 24 pages will constitute outer code), $\frac{1}{32}$ (1 out of 32 pages will constitute outer code), etc.

The various embodiments maintain a minimum allowable data storage capacity for the SSD memory over the operational life, maintain an acceptable level of inner code rate BER performance, and maintain at least a minimum available OP level to ensure background garbage collection can be efficiently performed as needed.

These and other features and advantages of various embodiments can be understood beginning with a review of FIG. 1 which provides a simplified functional block diagram of a data storage device 100. The device 100 has a controller 102 and a memory module 104.

The controller block 102 represents a hardware based and/or programmable processor based circuit configured to provide top level communication and control functions. The memory module 104 includes solid state non-volatile memory (NVM) for the storage of user data from a host device.

Figure 2:
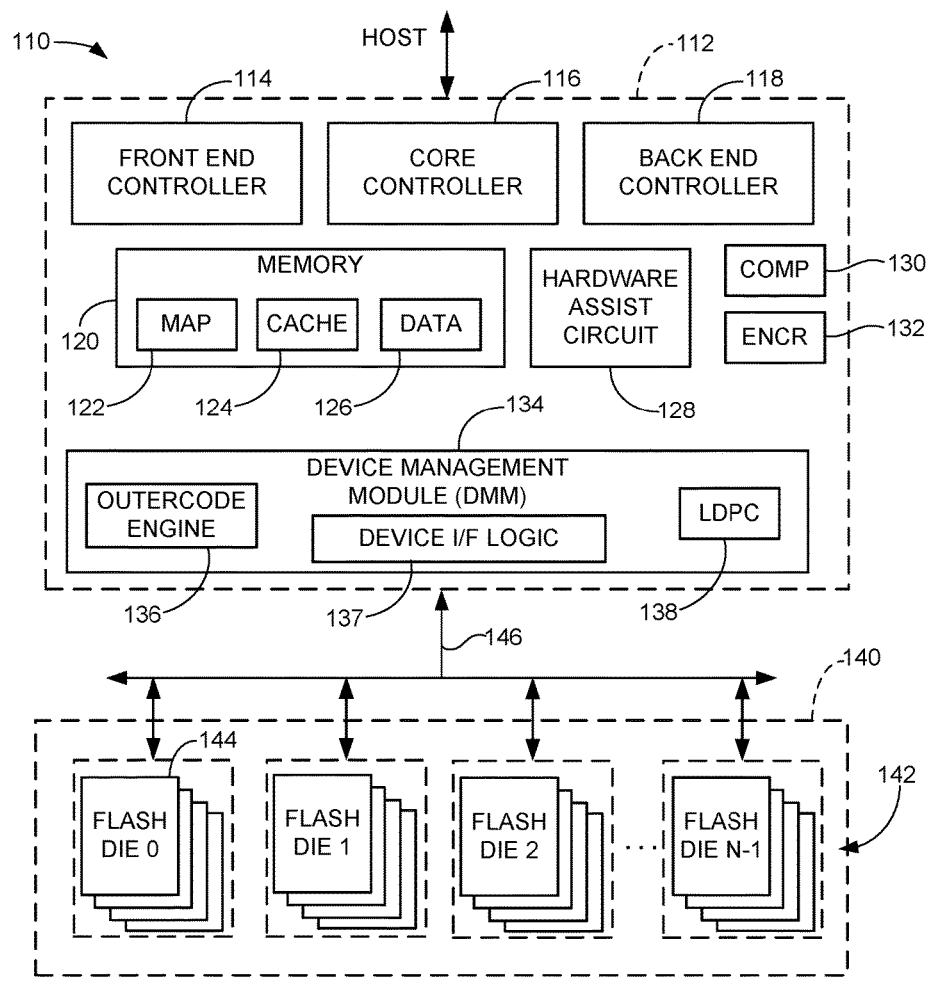
FIG. 2 shows aspects of the device of FIG. 1 characterized as a solid state drive (SSD) in accordance with some embodiments.

FIG. 2 shows a data storage device 110 generally corresponding to the device 100 in FIG. 1. The device 110 is configured as a solid state drive (SSD) that communicates with a host device via one or more Peripheral Component Interface Express (PCIe) ports, although other configurations can be used. The NVM is contemplated as comprising NAND flash memory, although other forms of solid state non-volatile memory can be used.

The SSD 110 includes a controller circuit 112 with a front end controller 114, a core controller 116 and a back end controller 118. The front end controller 114 performs host I/F functions, the back end controller 118 directs data transfers with the memory module 114 and the core controller 116 provides top level control for the device.

Each controller 114, 116 and 118 includes a separate programmable processor with associated programming (e.g., firmware, FW) in a suitable memory location, as well as various hardware elements to execute data management and transfer functions. This is merely illustrative of one embodiment; in other embodiments, a single programmable processor (or less/more than three programmable processors) can be configured to carry out each of the front end, core and back end processes using associated FW in a suitable memory location. A pure hardware based controller configuration can also be used. The various controllers may be integrated into a single system on chip (SOC) integrated circuit device, or may be distributed among various discrete devices as required.

A controller memory 120 represents various forms of volatile and/or non-volatile memory (e.g., SRAM, DDR DRAM, flash, etc.) utilized as local memory by the controller 112. Various data structures and data sets may be stored by the memory including one or more map structures 122, one or more caches 124 for map data and other control information, and one or more data buffers 126 for the temporary storage of host (user) data during data transfers.

A non-processor based hardware assist circuit 128 may enable the offloading of certain memory management tasks by one or more of the controllers as required. The hardware circuit 128 does not utilize a programmable processor, but instead uses various forms of hardwired logic circuitry such as application specific integrated circuits (ASICs), gate logic circuits, field programmable gate arrays (FPGAs), etc.

Additional functional blocks can be realized in hardware and/or firmware in the controller 112, such as a data compression block 130 and an encryption block 132. The data compression block 130 applies lossless data compression to input data sets during write operations, and subsequently provides data de-compression during read operations. The encryption block 132 provides any number of cryptographic functions to input data including encryption, hashes, decompression, etc.

A device management module (DMM) 134 supports back end processing operations and may include an outer code engine circuit 136 to generate outer code, a device I/F logic circuit 137 and a low density parity check (LDPC) circuit 138 configured to generate LDPC codes as part of the inner codes used by the SSD 110.

A memory module 140 corresponds to the memory 104 in FIG. 1 and includes a non-volatile memory (NVM) in the form of a flash memory 142 distributed across a plural number N of flash memory dies 144. Rudimentary control electronics (not separately shown) may be provisioned on each die 144 to facilitate parallel data transfer operations via one or more data bus paths 146.

While not limiting, it will be recognized by those skilled in the art that current generation SSDs and other data storage device systems can be formed from integrated memory modules such as 140 that are commercially available from a source of such devices. The memory modules may be integrated into an SSD by a device manufacturer which supplies the controller functions and tailors the controller to operate with the memory module. The controller and memory module are thus separate operational entities which communicate across one or more defined data and command interfaces. A "pull" system is commonly used in which the controller 112 issues commands and then repetitively checks (polls) the status of those commands by the memory module 140 to determine whether the commands have been completed.

Figure 3:
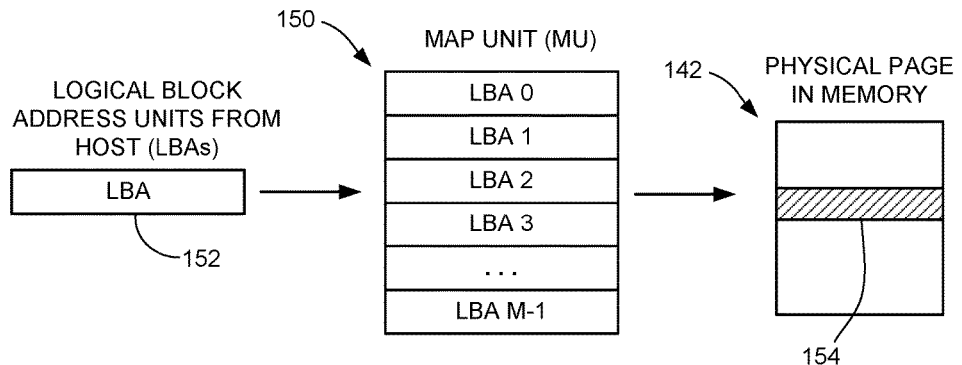
FIG. 3 illustrates a map unit (MU) as a data arrangement stored to the flash memory of FIG. 2.

FIG. 3 shows an example format for data stored to the flash memory 142. Map units (MUs) 150 represent fixed sized blocks of data that are made up of one or more user logical block address units (LBAs) 152 supplied by the host. Without limitation, the LBAs 152 may have a first nominal size, such as 512 bytes (B), 1024B (1 KB), etc., and the MUs 150 may have a second nominal size, such as 4096B (4 KB), etc. The application of data compression may cause each MU to have a smaller size in terms of actual bits written to the flash memory 142

The MUs 150 are arranged into pages 154 which are written to the memory. A page represents the smallest amount of data that may be written or read, and may represent nominally 8 KB, 16 KB, etc. Multiple pages may be written to the same flash memory cells connected to a common control line (e.g., word line) using multi-bit writing techniques; MLCs (multi-level cells) write two bits per cell, TLCs (three-level cells) write three bits per cell; XLCs (four level cells) write four bits per cell, etc.

Figure 4:
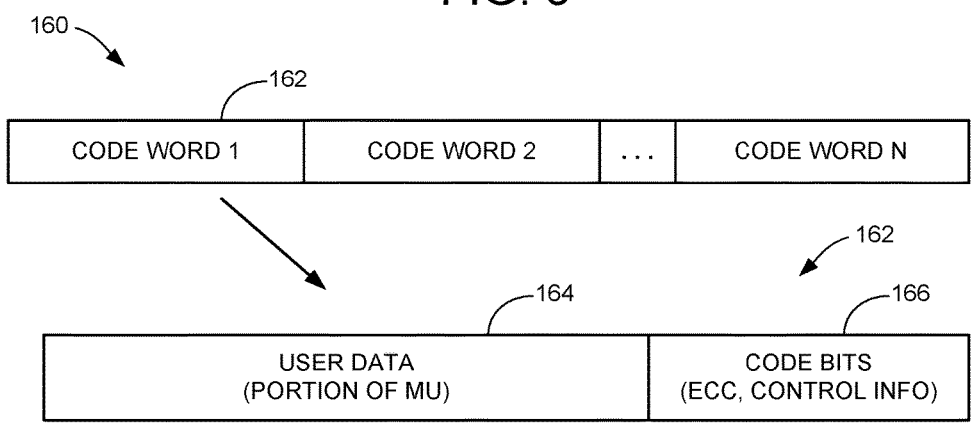
FIG. 4 shows an arrangement of code words having a user data payload and inner codes.

FIG. 4 shows an arrangement of data 160 written to a selected page 154 as an integer number of code words 162 of selected length. Each code word 162 includes a user data portion 164 and a code bit portion 166. The user data portion stores bits from one or more of the MUs 150 of FIG. 3. The code bit portion stores the LDPC or other error correction code (ECC) code bits as well as other control information associated with the user data bits. In the present embodiment, it will be understood that the code bits in the code bit portion 166 are written as inner code bits at a selected inner code rate to provide at least a desired BER for the user data bits in portion 164.

Figure 5:
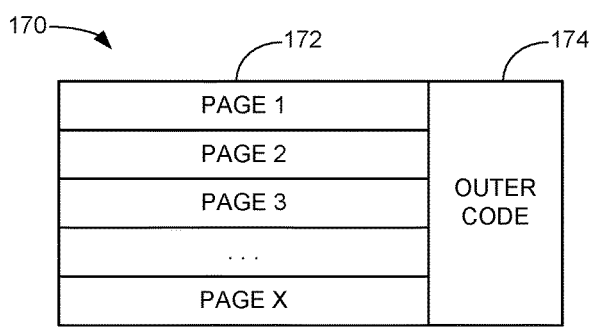
FIG. 5 shows an arrangement of outer codes used to protect a group of code words from FIG. 4.

FIG. 5 is a diagrammatical representation of a parity data set 170 made up of a plural number X data pages 172 that are protected by an outer code block 174. Each page 172 is formed of multiple code words 162 as in FIG. 4 and may be written at a selected location in a garbage collection unit (GCU) across multiple dies 144 (FIG. 2). The outer code block 174 represents parity values that enable the system to reconstruct the contents of one or more of the pages 172.

While not limiting, RAID type parity value techniques can be used to calculate the outer code parity values. In one embodiment, the outer code block 174 occupies essentially an entire page, so that X is some multiple number of pages and a code rate of 1/X is provided by the outer code. This is not limiting as the outer code can occupy any suitable amount of space in the flash memory, including less than or more than a page for a given parity set.

Figure 6:
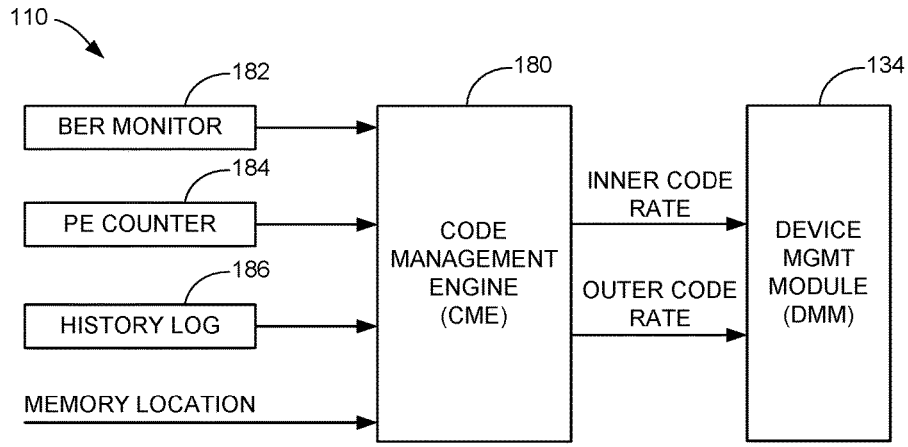
FIG. 6 is a functional block representation of a code management engine (CME) circuit operated to adjust the inner and outer code rates of FIGS. 3-4 in accordance with some embodiments.

FIG. 6 is a functional block representation of additional aspects of the SSD 110 in some embodiments. A code management engine 180 represents aspects of the controller 112 realized in hardware and/or firmware. The engine 180 operates over time to select appropriate inner code rates and outer code rates for the data to be stored by the DMM circuit 134 to the flash memory 142.

The engine 180 may utilize a number of inputs from other aspects of the system including a bit error rate (BER) monitor circuit 182, a program/erase (P/E) counter circuit 184, and a history log circuit 186. The BER monitor circuit 182 monitors observed BER performance of the system and provides indications, at appropriate times, that the BER has degraded to a sufficient extent that an increase in the inner code rate may be warranted.

The PE counter circuit 184 may operate to track the total number of P/E cycles that have occurred, with the engine 180 configured to increase the inner code rate at appropriate intervals (e.g., every X P/E cycles, etc.). The history log 186 may track other factors associated with various memory locations, such as the number of times uncorrectable errors were encountered, the number of times the outer code needed to be employed to recover data, etc.

Increases in the inner code rate are enacted via control inputs supplied to the DMM 134, which in turn increases the number of code bits 166 written to the flash. It is contemplated that the system will maintain the code words at a fixed size to retain the total number of code words per page at the desired integer number (e.g., 8 code words per page, etc.). If so, more code bits and fewer user data bits will be stored in each code word. Such is not necessary, as other embodiments are envisioned where code bits are added while not decreasing the size of the user data bit payload (e.g., code words expand over time to accommodate the additional code bits, etc.).

Regardless, increasing the inner code rate results in more code bits being written to the flash memory than before. As different portions of the flash memory may exhibit different performance characteristics, different inner code rates may be maintained on a page basis, an erasure block basis, a GCU basis and/or a die basis.

As noted above, as the inner code rate is increased, either the overall user data capacity or the available OP level will tend to be decreased if no other changes are made to the system. This may not be a problem in some cases. For example, if a large initial amount of OP is available in the system, such as a value of about 28%, an increase in inner code rate by about 3% would serve to drop the OP level to about 25%. This reduced OP level may still be sufficient to enable the system to operate at desired levels of performance without further adjustments.

On the other hand, in a high performance SSD with an OP level of only about 7%, a 3% reduction in OP due to an increase in the inner code rate may lead to significant problems in managing recycling (e.g., garbage collection) operations. Accordingly, the engine 180 further operates to decrease the outer code rate by a corresponding amount when the inner code rate is increased to maintain at least a selected amount of user data capacity and/or OP level.

Figure 7:
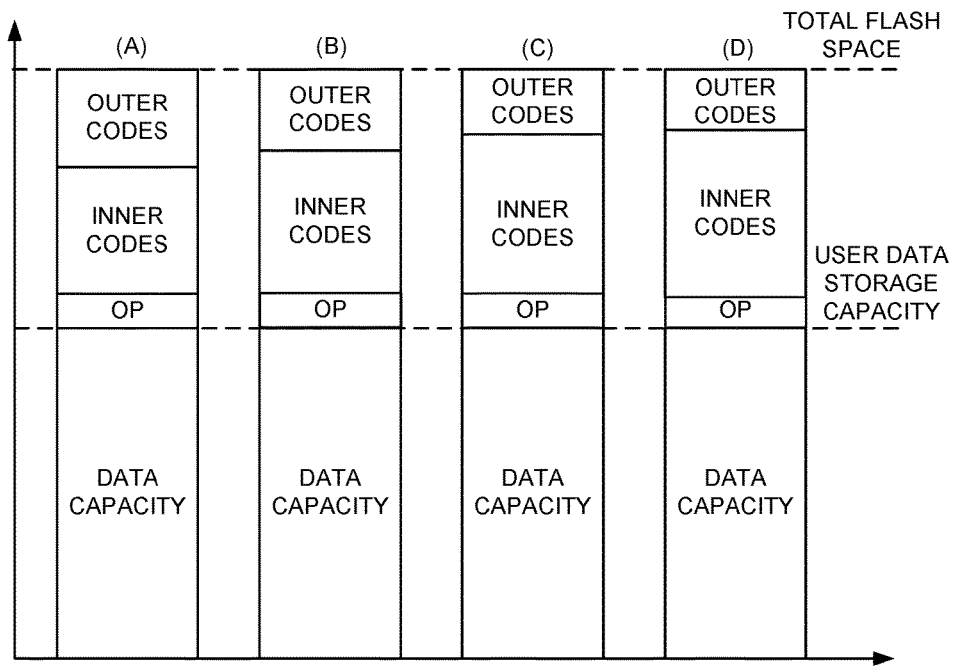
FIG. 7 shows changes in allocation of the flash memory by the circuit of FIG. 6 over time.

FIG. 7 is a bar chart showing changes in the allocation of the available flash memory space of the SSD 110 by the code management engine 180 of FIG. 6. The respective bars represent overall data capacity, OP, inner codes and outer codes at four successive times (A), (B), (C) and (D). The various relative sizes of the stacks in FIG. 7 are merely illustrative and are not necessarily drawn to scale.

As can be seen from FIG. 7, an initial configuration of the storage space of the flash memory 144 at time (A) provides a selected user data capacity, an initial overprovisioning (OP) level, an inner code rate and an outer code rate.

Over time, larger amounts of the overall data storage space are occupied by the inner codes, while the available data capacity and OP levels are nominally constant or at least remain above predetermined thresholds. As the inner code footprint is increased, the footprint of the outer code is generally decreased by a corresponding amount. It is noted that some reduction of OP is provided at time (D), but the overall OP remains above a predetermined threshold. As necessary, further increases in the inner code rate would continue to drive reductions in the outer code rate.

Figure 8A:
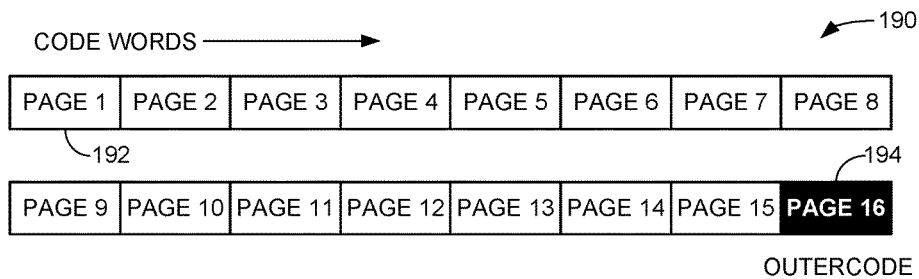
FIGS. 8A and 8B show different parity data sets having different outer code rates.
Figure 8B:
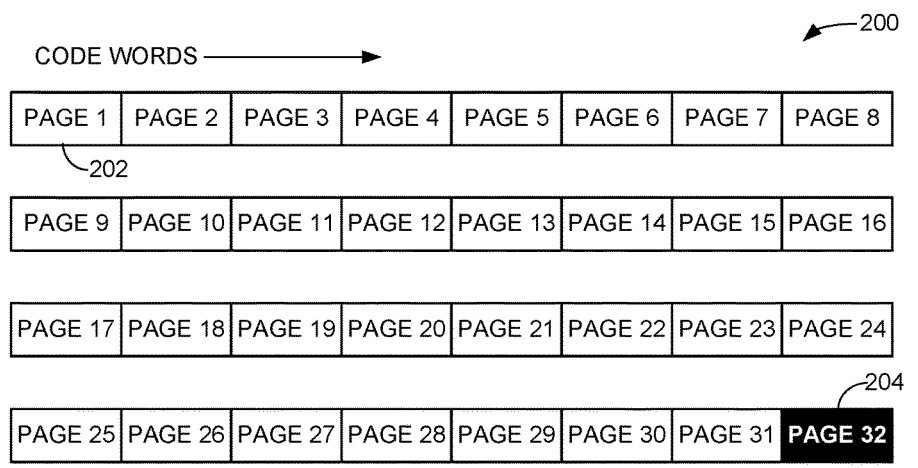

FIGS. 8A and 8B illustrate one manner in which the outer code rate can be reduced over time. Other methods can be used. FIG. 8A shows a parity data set 190 of fifteen (15) user data pages 192 and one (1) outer code parity page 194. Each user data page 192 stores code words as discussed above in FIG. 4. The outer code parity page 194 stores parity data for the pages as shown in FIG. 5. Each of the user data pages 192 and the outer code parity page 194 may be stored to a different die 144 (FIG. 2) within a given GCU.

This arrangement provides an initial outer code rate of $\frac{1}{16}$, or about 6.25%. Stated another way, the outer code is initially arranged such that parity pages are (generally) written to occupy 1 out of every 16 available pages, and the total amount of memory dedicated to the outer code is about 6.25% of the total available flash space.

During a data reconstruction operation involving the outer code, all sixteen pages of data in FIG. 8A will be retrieved to a local memory. Any corrupted data due to a block failure, uncorrectable error(s), etc. can be reconstructed by the combination of the user data/code words from the user data pages 192 and the parity data in the outer code page 194.

FIG. 8B shows a second parity data set 200 formed of thirty-one (31) user data pages 202 and one parity page 204. In this case, the total number of pages covered by the outer code has essentially doubled, and the outer code rate has been reduced to a value of $\frac{1}{32}$ or about 3.13%. Other respective ratios and reduction rates can be used; for example, if one parity page initially covers X pages, then this can be increased by any suitable increment to X+Y pages (e.g., from $\frac{1}{16}$ to $\frac{1}{18}$, $\frac{1}{20}$, $\frac{1}{22}$, etc.).

Different granularities can be used as well; for example, parity sets can be fixed at some initial number of code words that are covered by a corresponding unit of outer code. The number of code words is incrementally increased over time for that same unit of outer code. In some cases, an initial form of outer code is used with a certain type and ECC power, and a different form of outer code is subsequently used that may be more space efficient or better suited for a different amount of protected data. Without limitation, the outer code parity values can take a variety of forms including BCH, LDPC, Reed Solomon, checksums, etc.

Regardless, the increases in inner code rate maintain existing levels of performance (e.g., BER, etc.) due to P/E counts, wear, aging effects, etc. The corresponding decreases in the outer code rate enable the SSD to maintain user data capacity and OP levels at or above predetermined thresholds. In some cases, a small performance hit may be encountered since the outer code will need to be calculated and maintained for larger data sets, and data recovery operations at the parity set level will tend to involve a larger number of calculations. These and other considerations can be incorporated into the code adjustment scheme enacted by the controller.

Figure 9:
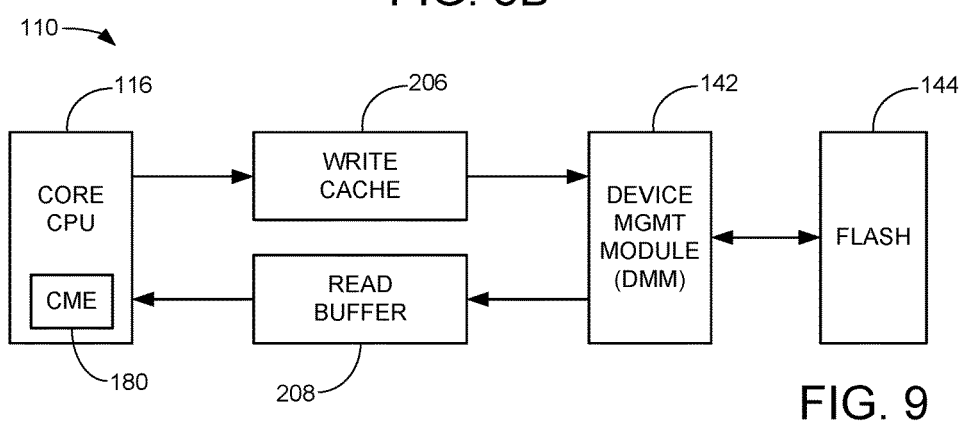
FIG. 9 shows further aspects of the SSD of FIG. 2.

FIG. 9 provides a functional block representation of additional aspects of the SSD 110. The core CPU 116 from FIG. 2 is shown in conjunction with the code management engine (CME) 180 of FIG. 6. During write operations, input write data from the host are received and processed to form MUs 150 (FIG. 3) which are placed into a non-volatile write cache 206 which may be flash memory or other form(s) of non-volatile memory. The MUs are transferred to the DMM circuit 134 for writing to the flash memory 144 in the form of code words 162 as described above. During read operations, one or more pages of data are retrieved to a volatile read buffer 208 for processing prior to transfer to the host.

The CME 180 determines the appropriate inner and outer code rates for the data generated and stored to memory. In some embodiments, the DMM circuit 134 may generate both the inner and outer codes. In other embodiments, the DMM circuit 134 generates the inner codes (see e.g., LDPC circuit 146 in FIG. 2) and the core CPU 116 generates the outer code words. In still other embodiments, the same processor/controller circuit generates both forms of code words. Other arrangements can be used as well. The CME 180 establishes appropriate code rates for both types of code words.

The CME 180 may utilize different inner code rates and different outer code rates for different locations within the flash memory 144. For example, one set of GCUs may exhibit worse BER performance and therefore require the use of higher inner code rates to compensate; another set of GCUs may exhibit better BER performance and enable the use of lower inner code rates. Similarly, different portions of the same GCU may require the use of different inner and/or outer codes. The various inner and outer code rates may thus be adaptively determined for individual blocks, dies, GCUs, pages, or combinations thereof.

Figure 10:
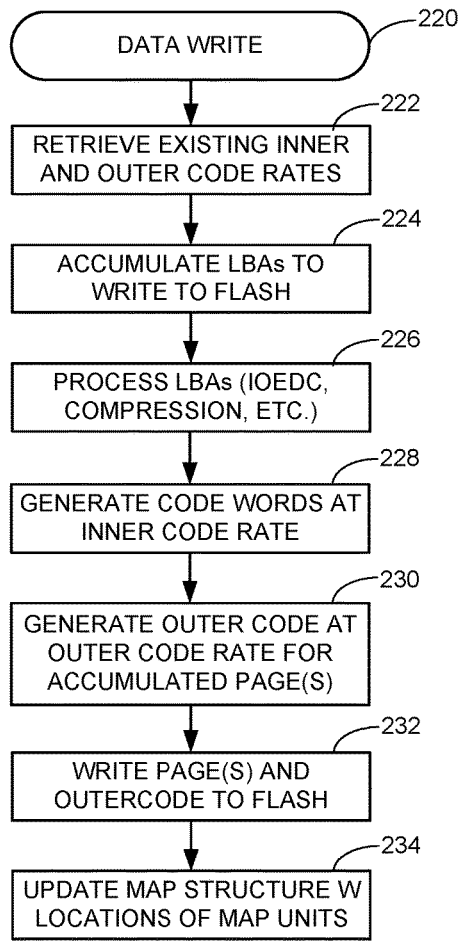
FIG. 10 is a data write routine.

FIG. 10 is a flow chart for a data write routine 220 illustrative of steps carried out by the SSD 110 in some embodiments to write (program) data to the flash memory 144. Responsive to a write command and associated write data, the controller 112 initially operates to retrieve the existing inner and outer code rates for the corresponding location to which the data are to be written, as indicated at step 222.

At step 224, the received user data blocks (e.g., LBAs) are accumulated into the local write buffer in the form of one or more MUs. Processing may be applied to these LBAs during the MU formation operation including data compression, encryption, encoding (including error correction codes such as IOEDC values, etc.), step 226.

The MUs are thereafter written to the flash memory by generating code words 162 with code bits at the specified inner code rate (step 228), generating the outer codes at the specified outer code rate for the various pages of code words (step 230), and writing the pages of code words and the corresponding outer codes to the flash memory (step 232). As required, the map structure (122, FIG. 2) is updated to indicate the locations of the various map units and other control data, step 234.

Figure 11:
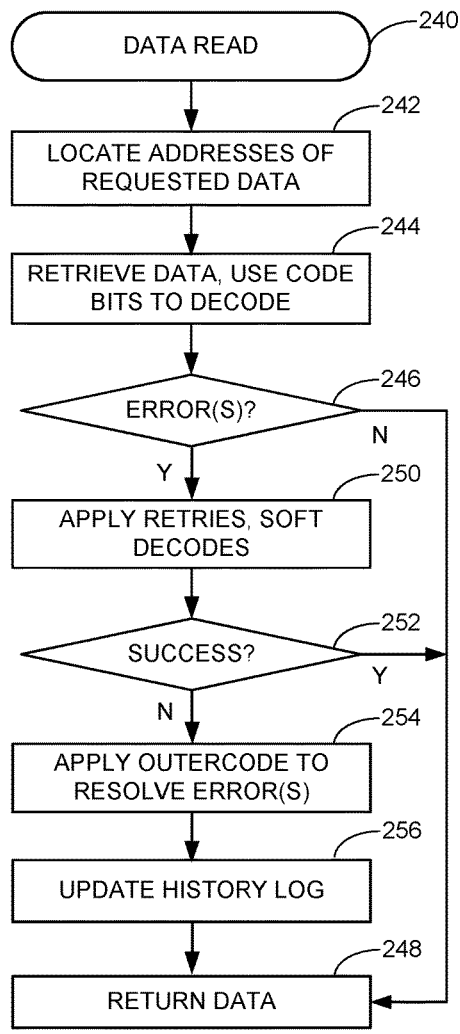
FIG. 11 is a data read routine.

FIG. 11 provides a flow chart for a data read routine 240 that may be subsequently carried out to read the data previously written by the routine of FIG. 10. As before, the routine commences with receipt of a read command such as from a requesting host.

The map data is used to locate the addresses of the various data sets in the flash memory at step 242. This may be at the code word level, and may include GCU, die, page, offset, etc. The command is issued to the DMM circuit 134 which retrieves the data from the flash memory and uses the inner code bits to decode the retrieved data, step 244.

Decision step 246 determines whether there are any uncorrectable errors as a result of this operation; normally it is anticipated that the answer will be no, and so the data are successfully returned at step 248. Thus, as noted above, in the vast majority of cases the outer codes will not be utilized at all during normal data transfer operations, and the inner codes will be able to successfully resolve any errors on the initial pass (iteration).

At such times that one or more uncorrectable errors are present, however, the flow passes from step 246 to step 250 where a number of normal read recovery operations are carried out. This can vary depending on the circumstances and may include a number of free retries where the data are simply re-read and sent to the LDPC decoder a second time (or multiple times); different read voltage thresholds can be applied to provide soft decode information, and so on. These error recovery operations all generally center on the use of the inner codes as part of the decoding process.

Decision step 252 determines whether the normal read recovery operations have been successful; if so, the data are returned at step 248 as before. At such time that the operations at step 250 are unable to resolve one or more uncorrectable errors, the flow passes to step 254 where the outer code values are enacted to resolve the remaining errors. As noted above in FIGS. 8A-8B, this may involve the reading of a larger number of associated pages of data and enacting parity data reconstruction. Other steps may be taken at this time as well, such as the relocation of the data, the marking of certain locations as defective, etc.

Nevertheless, it is contemplated that, in essentially all cases, the outer codes, through the brute force method of parity reconstruction, will be successful in returning the requested data, as is the experience of modern RAID parity techniques. In those limited cases where the outer codes are unsuccessful, an appropriate notification is supplied to the host device. As required, history log data may be updated at step 256 to indicate the invocation of the outer codes, along with the steps taken to resolve the situation.

Figure 12:
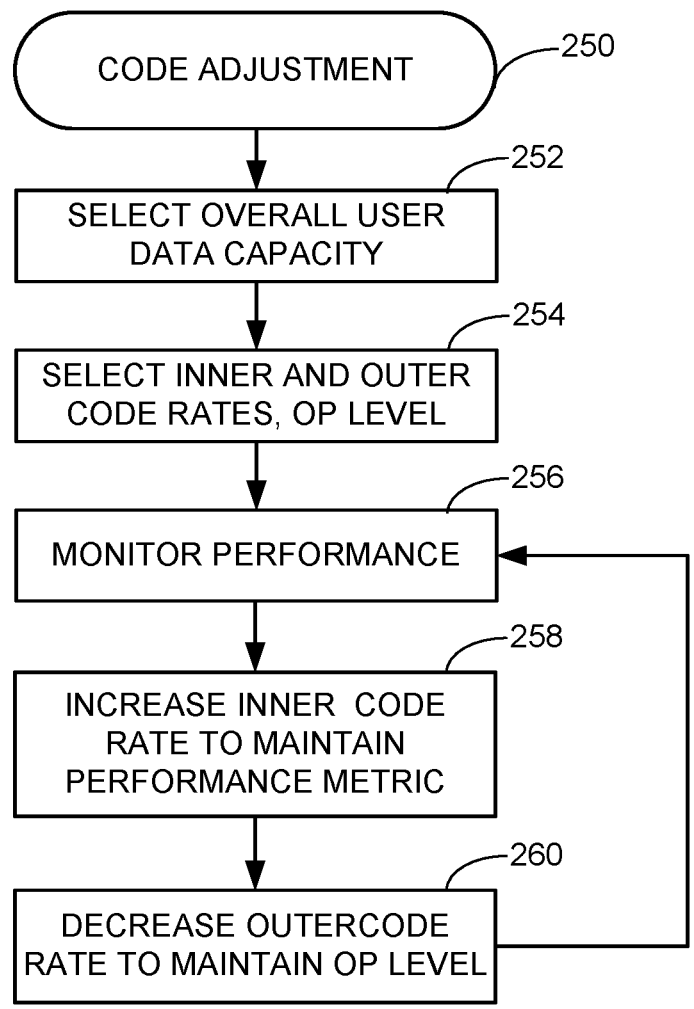
FIG. 12 is a code adjustment routine.

FIG. 12 is a flow chart for a code adjustment routine 250 illustrative of steps carried out in the background by the controller 112 during continued operation of the routines of FIGS. 10-11. The routine generally adaptively adjusts the inner code rate as required, and correspondingly adjusts the outer code rate to maintain a desired OP level.

Initially, an overall user data storage capacity is selected for the flash memory 144 at step 252, and corresponding inner and outer code rates and an available OP level are selected at step 254 to meet desired performance metrics. Performance of the SSD 110 is monitored over time, as indicated at step 256. At appropriate times, inner code rates for the various code words are increased at step 258 to maintain a desired performance metric (e.g., minimum acceptable BER, etc.). The outer code rate is decreased by some corresponding amount to maintain a minimum desired level of OP, step 260.

It will now be understood that at least some embodiments of the present disclosure provide a solid-state non-volatile memory (NVM) such as the flash memory 142 with a total user data storage capacity and an overprovisioning (OP) level (see e.g., FIG. 7). A control circuit such as the DMM circuit 134 writes parity data sets to the NVM, such as 170, 190 and 200. Each of the parity data sets has a plurality of code words such as 162 and an outer code such as 174. The code words include inner codes such as 166 at an inner code rate to detect and correct read errors (see e.g., step 244, FIG. 11) in a user data payload such as 164. The outer code includes parity data at an outer code rate to detect and correct read errors in the code words (see e.g., step 254, FIG. 11). A code adjustment circuit such as the circuit 180 increases the inner code rate to compensate for a measured parameter associated with the NVM, and decreases the outer code rate to maintain the data capacity and OP levels above selected thresholds (see e.g., FIG. 7).

While various embodiments have been described in the environment of a flash memory, such is merely illustrative. The various embodiments can be readily implemented into other forms of solid-state memory including but not limited to spin-torque transfer random access memory (STRAM), resistive random access memory (RRAM), phase change random access memory (PCRAM), magnetic random access memory (MRAM), etc.

It is to be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. An apparatus comprising:
   a solid-state non-volatile memory (NVM) having a total user data storage capacity and an overprovisioning (OP) level;
   a control circuit configured to write parity data sets to the NVM, each parity data set comprising a plurality of code words and an outer code, each of the plurality of code words comprising a user data payload and an inner code at an inner code rate to detect and correct read errors in the user data payload, the outer code comprising parity data at an outer code rate to detect and correct read errors in the plurality of code words; and
   a code adjustment circuit configured to increase the inner code rate of the inner code of at least one parity data set responsive to a measured parameter associated with the NVM, and to decrease the outer code rate of the outer code of the at least one parity data set responsive to the increase of the inner code rate to maintain the total user data storage capacity at or above a first threshold and to maintain the OP level at or above a second threshold.

2. The apparatus of claim 1, wherein the code adjustment circuit increases the inner code rate by increasing a size of the inner code in terms of a total number of bits stored to the NVM for an associated code word.

3. The apparatus of claim 1, wherein the code adjustment circuit decreases the outer code rate by increasing a total number of the code words protected by the outer code in the at least one parity data set so that a ratio between a total number of bits stored to the NVM for the outer code and a total number of bits stored to the NVM for the total number of the code words protected by the outer code is decreased.

4. The apparatus of claim 1, wherein each code word has a fixed size comprising a first number of bits corresponding to the user data payload and a second number of bits corresponding to the inner code, and wherein the code adjustment circuit increases the inner code rate by increasing the first number of bits and decreasing the second number of bits in each code word.

5. The apparatus of claim 1, wherein the NVM is an erasable memory, and the OP level comprises additional free space within the erasable memory that is maintained to facilitate garbage collection operations upon the NVM.

6. The apparatus of claim 5, wherein the first threshold represents a minimum data storage capacity communicated to a user of the NVM.

7. The apparatus of claim 1, wherein the inner code comprises LDPC (low density parity check) code bits used by an LDPC decoder to correct bit errors in the associated user data payload.

8. The apparatus of claim 1, wherein an integer number of the code words are written to each of a plurality of pages in the NVM, each page is stored across a set of solid-state memory cells in the NVM connected to a common word line, and the outer code in a selected parity data set protects the code words written to a plurality of pages.

9. The apparatus of claim 8, wherein the outer code occupies an additional page of the selected parity data set.

10. The apparatus of claim 8, wherein the code adjustment circuit provides a first outer code rate for a first parity data set in which the outer code protects a first integer number of pages, and wherein the code adjustment circuit reduces the first outer code rate to provide a second outer code rate for a second parity data set in which the outer code protects a second integer number of pages greater than the first integer number of pages.

11. The apparatus of claim 1, wherein the NVM comprises a flash memory having a plural number N dies each concurrently accessible using parallel data transfer lanes, wherein a selected parity data set comprises code words written to N−1 of the dies and the outer code written to the remaining one of the dies.

12. The apparatus of claim 1, wherein the NVM is a NAND flash memory, the control circuit is a device management module (DMM) circuit, and the code adjustment circuit forms a portion of a programmable processor of a controller coupled to the DMM circuit.

13. A method comprising:
writing a first parity data set to a non-volatile memory (NVM) comprising a plurality of code words and an outer code, each of the plurality of code words comprising a user data payload and an inner code at a first inner code rate to detect and correct read errors in the user data payload, the outer code comprising parity data at a first outer code rate to detect and correct read errors in the plurality of code words;
measuring a parameter associated with the NVM; and
subsequently writing a second parity data set to the NVM having a second inner code rate greater than the first inner code rate responsive to the measured parameter associated with the NVM and a second outer code rate less than the first outer code rate to maintain a total user data storage capacity of the NVM at or above a first threshold and to maintain an overprovisioning (OP) level of the NVM at or above a second threshold.

14. The method of claim 13, wherein the first inner code rate provides a first inner code in the first parity data set with a first total number of bits, and the second inner code rate provides a second inner code in the second parity data set with a second total number of bits greater than the first total number of bits.

15. The method of claim 13, wherein the first outer code rate corresponds to a first total number of the code words in the first parity data set, and the second outer code rate corresponds to a greater, second total number of the code words in the second parity data set.

16. The method of claim 13, wherein each code word has a fixed size comprising a first number of bits corresponding to the user data payload and a second number of bits corresponding to the inner code, and wherein the inner code rate is increased by increasing the first number of bits and decreasing the second number of bits in each code word.

17. The method of claim 13, wherein the NVM is an erasable memory, and the OP level comprises additional free space within the erasable memory that is maintained to facilitate garbage collection operations upon the NVM.

18. The method of claim 13, wherein the inner code comprises LDPC (low density parity check) code bits used by an LDPC decoder to correct bit errors in the associated user data payload.

19. The method of claim 13, wherein an integer number of the code words are written to each of a plurality of pages in the NVM, each page is stored across a set of solid-state memory cells in the NVM connected to a common word line, and the outer code in a selected parity data set protects the code words written to a plurality of pages.

20. The method of claim 13, wherein the NVM is a NAND flash memory.

* * * * *